(12) United States Patent
Ikebe et al.

(10) Patent No.: US 11,187,972 B2
(45) Date of Patent: Nov. 30, 2021

(54) REFLECTIVE MASK BLANK, METHOD OF MANUFACTURING REFLECTIVE MASK AND METHOD OF MANUFACTURING SEMICONDUCTOR DEVICE

(71) Applicant: HOYA CORPORATION, Tokyo (JP)

(72) Inventors: Yohei Ikebe, Tokyo (JP); Tsutomu Shoki, Tokyo (JP)

(73) Assignee: HOYA CORPORATION, Tokyo (JP)

(*) Notice: Subject to any disclaimer, the term of this patent is extended or adjusted under 35 U.S.C. 154(b) by 306 days.

(21) Appl. No.: 16/343,505

(22) PCT Filed: Oct. 18, 2017

(86) PCT No.: PCT/JP2017/037685
§ 371 (c)(1),
(2) Date: Apr. 19, 2019

(87) PCT Pub. No.: WO2018/074512
PCT Pub. Date: Apr. 26, 2018

(65) Prior Publication Data
US 2019/0265585 A1    Aug. 29, 2019

(30) Foreign Application Priority Data

Oct. 21, 2016    (JP) .............................. JP2016-206953

(51) Int. Cl.
*G03F 1/24* (2012.01)
*G03F 7/20* (2006.01)

(52) U.S. Cl.
CPC .............. *G03F 1/24* (2013.01); *G03F 7/2004* (2013.01)

(58) Field of Classification Search
CPC .................................. G03F 1/24; G03F 7/2004
USPC ............................................................ 430/5
See application file for complete search history.

(56) References Cited

U.S. PATENT DOCUMENTS

| | | |
|---|---|---|
| 4,599,737 A | 7/1986 | Kimura et al. |
| 5,641,593 A | 6/1997 | Watanabe et al. |
| 6,656,643 B2 | 12/2003 | Gupta et al. |
| 2002/0115000 A1 | 8/2002 | Gupta et al. |
| 2005/0186486 A1 | 8/2005 | Sugawara |
| 2005/0238963 A1 | 10/2005 | Ishibashi et al. |
| 2006/0057469 A1 | 3/2006 | Kureishi et al. |
| 2007/0015065 A1 | 1/2007 | Abe et al. |
| 2007/0259276 A1 | 11/2007 | Yoshikawa et al. |
| 2008/0206655 A1 | 8/2008 | Nozawa et al. |
| 2009/0220869 A1 | 9/2009 | Takai |
| 2013/0078553 A1 | 3/2013 | Sakai et al. |
| 2013/0196255 A1 | 8/2013 | Hayashi |
| 2013/0309598 A1 | 11/2013 | Fukaya et al. |
| 2013/0316272 A1 | 11/2013 | Hayashi et al. |
| 2015/0079502 A1 | 3/2015 | Suzuki et al. |
| 2016/0011502 A1 | 1/2016 | Hofmann et al. |
| 2016/0161837 A1 | 6/2016 | Hamamoto et al. |
| 2017/0263444 A1 | 9/2017 | Shoki et al. |
| 2018/0267398 A1 | 9/2018 | Irie et al. |

FOREIGN PATENT DOCUMENTS

| | | |
|---|---|---|
| EP | 2664959 A1 | 11/2013 |
| JP | S5950443 A | 3/1984 |
| JP | H0334414 A | 2/1991 |
| JP | H07114173 A | 5/1995 |
| JP | 08-184955 A | 7/1996 |
| JP | H09298150 A | 11/1997 |
| JP | 2002-261005 A | 9/2002 |
| JP | 2002299227 A | 10/2002 |
| JP | 2004-039884 A | 2/2004 |
| JP | 2005-268750 A | 9/2005 |
| JP | 2005236074 A | 9/2005 |
| JP | 2006-078825 A | 3/2006 |
| JP | 2006173502 A | 6/2006 |
| JP | 2006-324268 A | 11/2006 |
| JP | 2008-268980 A | 11/2008 |
| JP | 2009-212220 A | 9/2009 |
| JP | 2010-080659 A | 4/2010 |
| JP | 5009649 B2 | 8/2012 |
| JP | 2012209481 A | 10/2012 |
| JP | 2013-083933 A | 5/2013 |
| JP | 2013-218301 A | 10/2013 |
| JP | 2013210424 A | 10/2013 |
| JP | 2014053576 A | 3/2014 |
| JP | 2014192312 A | 10/2014 |
| JP | 2015133514 A | 7/2015 |
| JP | 2016046370 A | 4/2016 |
| JP | 2016063020 A | 4/2016 |

(Continued)

OTHER PUBLICATIONS

International Search Report of PCT/JP2017/037685 dated Jan. 23, 2018.
JP2018-546378, "Notice of Reasons for Refusal", dated Dec. 15, 2020, 9 pages.
SG11201903409S, "Invitation to Respond to Written Opinion", dated Feb. 25, 2021, 7 pages.
SG11201903409S, Search Report and Written Opinion, dated May 9, 2020, 6 pages.
TW106136066, "Office Action", dated May 13, 2021, 9 pages.
JP2018-546378, Decision of Refusal with Machine Translation, dated Jul. 20, 2021, 9 pages.

*Primary Examiner* — Christopher G Young
(74) *Attorney, Agent, or Firm* — Kilpatrick Townsend & Stockton LLP

(57) ABSTRACT

The present invention provides a reflective mask blank and reflective mask capable of reducing the shadowing effect of EUV lithography and forming a fine pattern. As a result, a semiconductor device can be more stably manufactured with high transfer accuracy. The reflective mask blank comprises a multilayer reflective film, an absorber film and an etching mask film on a substrate in that order, wherein the absorber film is made of a material containing nickel (Ni), and the etching mask film is made of a material containing chromium (Cr) or a material containing silicon (Si).

21 Claims, 5 Drawing Sheets

(56) References Cited

FOREIGN PATENT DOCUMENTS

| | | |
|---|---|---|
| JP | 2016-126319 A | 7/2016 |
| JP | 5971122 B2 | 7/2016 |
| JP | 2016-139675 A | 8/2016 |
| JP | 2016167052 A | 9/2016 |
| JP | 2017525999 A | 9/2017 |
| TW | 200424750 A | 11/2004 |
| TW | 201518855 A | 5/2015 |
| TW | 201602716 A | 1/2016 |
| WO | 2016159043 A1 | 10/2016 |

REFLECTIVE MASK BLANK, METHOD OF MANUFACTURING REFLECTIVE MASK AND METHOD OF MANUFACTURING SEMICONDUCTOR DEVICE

CROSS REFERENCE TO RELATED APPLICATIONS

This application is a National Stage of International Application No. PCT/JP2017/037685 filed Oct. 18, 2017, claiming priority based on Japanese Patent Application No. 2016-206953 filed Oct. 21, 2016.

TECHNICAL FIELD

The present invention relates to a master plate in the form of a reflective mask blank for manufacturing a mask for exposure used in the manufacturing of a semiconductor device and the like. In addition, the present invention relates to a method of manufacturing a reflective mask produced using this reflective mask blank, and to a method of manufacturing a semiconductor device.

BACKGROUND ART

The types of light sources of exposure apparatuses used in the manufacturing of semiconductors include the g-line having a wavelength of 436 nm, i-line having a wavelength of 365 nm, KrF lasers having a wavelength of 248 nm and ArF lasers having a wavelength of 193 nm. The wavelengths of the light sources of exposure apparatuses are gradually becoming shorter in order to realize transfer of even finer patterns. EUV lithography is being developed that uses extreme ultraviolet (EUV) light having a wavelength in the vicinity of 13.5 nm in order to realize even finer pattern transfer. In EUV lithography, a reflective mask is used due to the lack of materials that are transparent to EUV light. The basis structure of this reflective mask consists of the formation of a multilayer protective film that reflects exposure light and a protective film for protecting the multilayer reflective film on a low thermal expansion substrate, and the formation of a desired transfer pattern on the protective film. In addition, typical examples of reflective masks (reflecting masks) consist of binary reflective masks having a comparatively thick absorber pattern (transfer pattern) that adequately absorbs EUV light, and phase shift reflective masks (halftone phase shift transfer masks) having a comparatively thin absorber pattern (transfer pattern) that generates reflected light in which the phase is nearly completely inverted (phase inversion of about 180° C.) relative to light reflected from the multilayer reflective film. Phase shift reflective masks (halftone phase shift reflective masks) allow the obtaining of high transferred optical image contrast due to phase shift effects in the same manner as transmissive optical phase shift masks, thereby making it possible to improve resolution. In addition, a highly precise, fine phase shift pattern can be formed due to the thin film thickness of the absorber pattern (phase shift pattern) of the phase shift reflective mask.

Projection optical systems composed of a large number of reflecting mirrors are used in EUV lithography based on the relationship with light transmittance. As a result of EUV light entering a reflective mask on an angle, these multiple reflecting mirrors do not block the projected light (exposure light). It is currently common to use an incident angle of 6° for the incident angle relative to the perpendicular plane of the reflective mask substrate. As the numerical aperture (NA) of the projection optical system is improving, studies are proceeding for achieving a more oblique incident angle (of about 8°).

EUV lithography has a unique problem referred to as the shadowing effect as a result of exposure light entering on an oblique angle. The shadowing effect refers to a phenomenon in which the dimensions and/or location of a pattern formed by transfer are changed due to the formation of shadows caused by the entry of exposure light into an absorber pattern having a three-dimensional structure on an oblique angle. The three-dimensional structure of the absorber pattern serves as a wall that allows the formation of a shadow on the shady side, thereby causing change of the dimensions and/or location of the pattern formed by transfer. For example, due to the relationship between the orientation of an arranged absorber pattern and the incident direction of oblique incident light, if there is a difference in the orientation of the absorber pattern relative to the incident direction of the oblique incident light, a difference occurs in the dimensions and location of the transfer pattern, thereby resulting in a decrease in transfer accuracy.

Technologies relating to such reflective masks for EUV lithography and mask blanks used for the manufacturing thereof are disclosed in Patent Documents 1 to 5. In addition, Patent Documents 1 and 2 contain disclosures regarding the shadowing effect. The use of a phase shift reflective mask as a reflective mask for EUV lithography has been proposed in the past. In the case of a phase shift reflective mask, the film thickness of the phase shift pattern can be made to comparatively thinner than the case of a binary reflective mask. Consequently, decreases in transfer accuracy caused by the shadowing effect can be suppressed.

PRIOR ART DOCUMENTS

Patent Documents

Patent Document 1: JP 2010-080659 A
Patent Document 2: JP 2009-212220 A
Patent Document 3: JP 2005-268750 A
Patent Document 4: JP 2004-39884 A
Patent Document 5: JP 5009649 B

DISCLOSURE OF THE INVENTION

Problems to be Solved by the Invention

The electrical properties and performance of semiconductor devices improve the finer the pattern and the better the accuracy of the pattern dimensions and location, thereby making it possible to improve the degree of integration and reduce chip size.

Consequently, EUV lithography requires an even higher level of high-precision, fine-dimension pattern transfer performance than in the prior art. At present, high-precision pattern formation is required for half-pitch 16 nm (hp16 nm) generation. In order to satisfy this requirement, the absorber pattern of the reflective mask is required to be even thinner in order to reduce shadowing effects. In the case of EUV exposure in particular, it is necessary to reduce film thickness of the absorber film (phase shift film) to 50 nm or less.

With the foregoing in view, an object of the present invention is to further reduce the shadowing effect of a reflective mask while providing a reflective mask blank capable of forming a fine and highly precise absorber pattern. In addition, an object of the present invention is to provide a reflective mask fabricated using this reflective mask blank and a method of manufacturing a semiconductor device.

Means for Solving the Problems

The present invention has the following configurations in order to solve the aforementioned problems.

(Configuration 1)

A reflective mask blank comprising a multilayer reflective film, an absorber film and an etching mask film on a substrate in that order; wherein, the absorber film is made of a material containing nickel (Ni), and the etching mask film is made of a material containing chromium (Cr) or a material containing silicon (Si).

(Configuration 2)

The reflective mask blank described in Configuration 1, wherein the etching mask film is made of a material containing chromium (Cr) and substantially containing no oxygen (O).

(Configuration 3)

The reflective mask blank described in Configuration 1 or 2, comprising a protective film between the multilayer reflective film and the absorber film, and wherein, the protective film is made of a material containing ruthenium (Ru).

(Configuration 4)

A method of manufacturing a reflective mask, including:

forming a resist pattern on the etching mask film of the reflective mask blank described in any of Configurations 1 to 3, the etching mask film being made of a material containing chromium (Cr), forming an etching mask pattern by using the resist pattern as a mask and patterning the etching mask film by dry etching with a dry etching gas containing a chlorine-based gas and oxygen gas, and forming an absorber pattern by using the etching mask pattern as a mask and patterning the absorber film by dry etching with a dry etching gas that contains a chlorine-based gas and substantially contains no oxygen.

(Configuration 5)

A method of manufacturing a reflective mask, including:

forming a resist pattern on the etching mask film of the reflective mask blank described in any of Configurations 1 to 3, the etching mask film being made of a material containing silicon (Si), forming an etching mask pattern by using the resist pattern as a mask and patterning the etching mask film by dry etching with a dry etching gas containing a fluorine-containing gas, and forming an absorber pattern by using the etching mask pattern as a mask and patterning the absorber film by dry etching with a dry etching gas that contains a chlorine-based gas and substantially contains no oxygen.

(Configuration 6)

The method of manufacturing a reflective mask described in Configuration 4 or 5, wherein the etching mask pattern is stripped after having formed the absorber pattern.

(Configuration 7)

A method of manufacturing a semiconductor device having a step for placing the reflective mask obtained according to the method of manufacturing a reflective mask described in any of Configurations 4 to 6 in an exposure apparatus having an exposure light source emitting EUV light, and transferring a transfer pattern to a resist film formed on a transferred substrate.

Effects of the Invention

According to the reflective mask blank of the present invention (and a reflective mask produced using the same), the film thickness of an absorber film can be reduced, shadowing effect can be reduced, and a fine and highly precise absorber pattern can be formed with little sidewall roughness and with a stable cross-sectional shape. Thus, a reflective mask produced using a reflective mask blank employing this structure is not only allows the fine and highly precise formation of the absorber pattern per se formed on the mask, but also is able to prevent a decrease in accuracy during transfer attributable to shadowing. In addition, carrying out EUV lithography using this reflective mask makes it possible to provide a method of manufacturing a fine and highly precise semiconductor device.

MODE FOR CARRYING OUT THE INVENTION

The following provides a detailed explanation of embodiments of the present invention with reference to the drawings. Furthermore, the following embodiments are aspects obtained during embodiment of the present invention and do not limit the present invention to within the scope thereof. Furthermore, the same reference symbols are used to represent the same or corresponding portions and explanations thereof may be simplified and/or omitted.

<Configuration and Method of Manufacturing Reflective Mask Blank>

Figure 1:
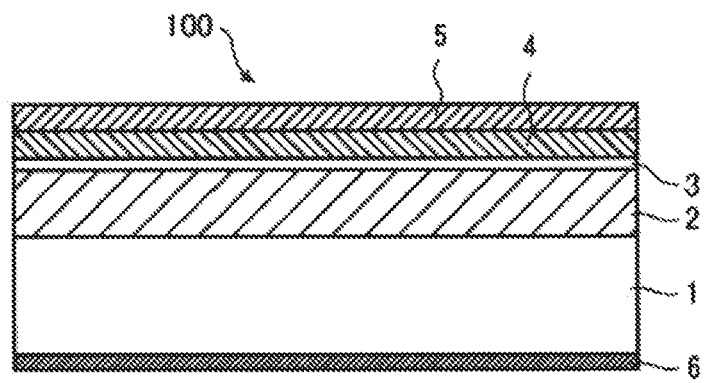
FIG. 1 is a cross-sectional schematic diagram of the main portions the reflective mask blank of the present invention for explaining the general configuration thereof.

FIG. 1 is a cross-sectional schematic diagram of the main portions of the reflective mask blank of the present invention for explaining the configuration thereof. As is shown in FIG. 1, a reflective mask blank 100 has a substrate 1, a multilayer reflective film 2, a protective film 3, an absorber film 4 that absorbs EUV light and an etching mask film (etching hard mask) 5, and these are laminated in this order. The multilayer reflective film 2 is formed on the side of a first main surface (front side) and reflects exposure light in the form of EUV light. The protective film 3 is provided to protect the multilayer reflective film 2. The protective film 3 is formed with a material having resistance to an etchant and cleaning solution used when patterning the absorber film 4 to be subsequently described. The etching mask film 5 serves as a mask when etching the absorber film 4. In addition, a back side conductive film 6 for electrostatic chucking is normally formed on the side of a second main surface (back side) of the substrate 1.

The following provides an explanation of each layer.

«Substrate»

A substrate is preferably used for the substrate 1 that has a low coefficient of thermal expansion within the range of 0±5 ppb/° C. in order to prevent deformation of the absorber pattern caused by heat during exposure by EUV light. Examples of materials having a low coefficient of thermal expansion within this range that can be used include $SiO_2$—$TiO_2$-based glass and multicomponent glass ceramics.

The first main surface of the substrate 1 on the side on which the transfer pattern (that is composed by the absorber film 4 to be subsequently described) is formed is subjected to surface processing so as to demonstrate high flatness from the viewpoint of at least obtaining pattern transfer accuracy and positional accuracy. In the case of EUV exposure, flatness in a region measuring 132 mm×132 mm of the main surface of the substrate 12 on which a transfer pattern is formed is preferably not more than 0.1 μm, more preferably not more than 0.05 μm and particularly preferably not more than 0.03 μm. In addition, the second main surface on the opposite side from the first main surface is a surface that is electrostatically chucked when placing in an exposure apparatus. The flatness of the second main surface in a region measuring 132 mm×132 mm is preferably not more than 0.1 μm, more preferably not more than 0.05 μm and particularly preferably not more than 0.03 μm. Furthermore, the flatness of the second main surface in the reflective mask blank 100 in a region measuring 142 mm×142 mm is preferably not more than 1 μm, more preferably not more than 0.5 μm and particularly preferably not more than 0.3 μm.

In addition, the height of surface smoothness of the substrate 1 is also an extremely important parameter. The surface roughness of the first main surface on which a phase shift pattern for transfer is formed in terms of root mean square (RMS) roughness is preferably not more than 0.1 nm. Furthermore, surface smoothness can be measured with an atomic force microscope.

Moreover, the substrate 1 preferably has high rigidity to prevent deformation caused by film stress of a film formed thereon (such as the multilayer reflective film 2). In particular, the substrate 1 preferably has a high Young's modulus of not less than 65 GPa.

«Multilayer Reflective Film»

The multilayer reflective film 2 imparts a function that reflects EUV light in a reflective mask 200. The multilayer reflective film 2 has the configuration of a multilayer film in which each layer composed mainly of elements having different refractive indices is cyclically laminated.

In general, a multilayer film obtained by alternately laminating roughly 40 to 60 cycles of a thin film composed of a high refractive index material in the form of a light element or compound thereof (high refractive index layer) and a thin film composed of a low refractive index material in the form of a heavy element or compound thereof (low refractive index layer) is used for the multilayer reflective film 2. The multilayer film may have a structure obtained by laminating for a plurality of cycles, with one cycle consisting of a laminated structure of a high refractive index layer/low refractive index layer obtained by laminating a high refractive index layer and low refractive index layer in that order starting from the side of the substrate 1, or the multilayer film may have a structure obtained by laminating for a plurality of cycles, with one cycle consisting of a laminated structure of low refractive index layer/high refractive index layer obtained by laminating a low refractive index layer and high refractive index layer in that order starting from the side of the substrate 1. Furthermore, the layer on the uppermost side of the multilayer reflective film 2 (namely the front side layer of the multilayer reflective film 2 on the opposite side from the substrate 1) is preferably a high refractive index layer. In the aforementioned multilayer film, in the case of laminating for a plurality of cycles, with one cycle consisting of a laminated structure obtained by laminating a high refractive index layer and low refractive index layer (high refractive index layer/low refractive index layer) in that order on the substrate 1, the uppermost layer is a low refractive index layer. Since the low refractive index layer on the uppermost side of the multilayer reflective film 2 ends up being oxidized easily, reflectivity of the multilayer reflective film 2 decreases. In order to avoid this decrease in reflectivity, the multilayer reflective film is preferably obtained by further forming a high refractive index layer on the low refractive index layer of the uppermost layer. On the other hand, in the aforementioned multilayer film, in the case of laminating for a plurality of cycles, with one cycle consisting of a laminated structure obtained by laminating a low refractive index layer and high refractive index layer (low refractive index layer/high refractive index layer) in that order on the substrate 1, the uppermost layer is a high refractive index layer. In this case, it is not necessary to additionally form a high refractive index layer.

In the present embodiment, a layer containing silicon (Si) is used as a high refractive index layer. Si alone or an Si compound containing Si and boron (B), carbon (C), nitrogen (N) and/or oxygen (O) can be used for the material containing Si. As a result of using a layer containing Si as a high refractive index layer, a reflective mask 200 for EUV lithography can be obtained that demonstrates superior reflectivity of EUV light. In addition, in the present embodiment, a glass substrate is preferably used for the substrate 1. Si demonstrates superior adhesiveness with glass substrates. In addition, a metal selected from molybdenum (Mo), ruthenium (Ru), rhodium (Rh) and platinum (Pt), or an alloy thereof, is used as a low refractive index layer. For example, a Mo/Si cyclically laminated film, obtained by alternately laminating an Mo film and Si film for about 40 to 60 cycles, is preferably used for the multilayer reflective film 2 with respect to EUV light having a wavelength of 13 nm to 14 nm. Furthermore, the uppermost layer in the form of a high refractive index layer of the multilayer reflective film 2 is formed with silicon (Si), and a silicon oxide layer containing silicon and oxygen can be formed between the uppermost layer (Si) and the Ru-based protective film 3. As a result of forming a silicon oxide layer, the resistance of the reflective mask 200 to cleaning can be improved.

The reflectivity of the aforementioned multilayer reflective film 2 alone is normally not less than 65% and the upper limit thereof is normally 73%. Furthermore, the thickness and number of cycles of each layer composing the multilayer reflective film 2 are suitably selected according to exposure wavelength so as to, for example, satisfy Bragg's law. A plurality of a high refractive index layer and low refractive index layer are present in the multilayer reflective film 2. The plurality of high refractive index layers is not required to have the same thickness, and the plurality of low refractive index layers is not required to have the same film thickness. In addition, the film thickness of the Si layer of the uppermost side of the multilayer reflective film 2 can be adjusted within a range that does not cause a decrease in reflectivity. Film thickness of the Si on the uppermost side (high refractive index layer) can be 3 nm to 10 nm.

Methods for forming the multilayer reflective film 2 are known in the art. For example, each layer of the multilayer reflective film 2 can be deposited by ion beam sputtering. In the case of the aforementioned Mo/Si cyclically laminated film, an Si film having a film thickness of about 4 nm is first deposited on the substrate 1 by ion beam sputtering using an Si target, after which an Mo film having a film thickness of about 3 nm is deposited using an Mo target. When defining the deposition of the Si film and Mo film as constituting one cycle, the multilayer reflective film 2 is formed by laminating for a total of 40 to 60 cycles. Furthermore, the layer on the uppermost side of the multilayer reflective film 2 is preferably an Si layer.

«Protective Film»

The protective film 3 is formed on the multilayer reflective film 2 in order to protect the multilayer reflective film 2 from dry etching and cleaning in the fabrication process of the reflective mask blank 200 to be subsequently described. In addition, the multilayer reflective film 2 can be protected by the protective film 3 when repairing opaque defects in a phase shift pattern using an electron beam (EB). FIG. 1 shows the case of the protective film 3 consisting of a single layer. The protective film 3 can also have a laminated structure consisting of not less than three layers. For example, a structure can be employed in which a layer composed of a substance containing the aforementioned Ru is used for the lowermost layer and uppermost layer of the protective film 3, and a metal or alloy other than Ru is interposed between the lowermost layer and the uppermost layer. A material containing ruthenium as the main component thereof, such as Ru metal alone or an Ru alloy containing Ru and titanium (Ti), niobium (Nb), molybdenum (Mo), zirconium (Zr), yttrium (Y), boron (B), lanthanum (La), cobalt (Co) or rhenium (Re), can be used for the material of the protective film 3. In addition, these materials of the protective film can further contain nitrogen. Among these materials, an Ru-based protective film containing Ti is used particularly preferably. In the case of using an Ru-based protective film containing Ti, diffusion of silicon, that is a constituent element of the multilayer reflective film, from the surface of the multilayer reflective film 2 into the Ru-based protective film decreases. Consequently, this is characterized by a reduction in surface roughness as well as increased resistance to the occurrence of film separation when cleaning the mask. The reduction in surface roughness is directly connected to prevention of a decrease in reflectivity with respect to EUV exposure. Consequently, reduction of surface roughness is important for improving the exposure efficiency of EUV exposure and improving throughput.

In the case of using an Ru alloy for the material of the protective film 3, the content ratio of Ru of the Ru alloy is not less than 50% at % to less than 100 at %, preferably not less than 80 at % to less than 100 at %, and more preferably not less than 95 at % to less than 100 at %. In the case the content ratio of Ru of the Ru alloy is not less than 95 at % to less than 100 at % in particular, reflectivity of EUV light can be adequately ensured while suppressing diffusion of a constituent element (silicon) of the multilayer reflective film into the protective film 3. Moreover, this protective film 3 can also be provided with an etching stop function used when etching the absorber film 4 as well as a protective film function for preventing time-based changes in the multilayer reflective film.

In the case of EUV lithography, since there are few substances that are transparent with respect to exposure light, it is not technically easy to provide an EUV pellicle that prevents adhesion of foreign matter to the surface of the mask pattern. Thus, pellicle-less applications not employing a pellicle have become common. In addition, in the case of EUV lithography, exposure contamination occurs in the manner of deposition of a carbon film or growth of an oxide film on the mask caused by EUV exposure. Consequently, it is necessary to remove foreign matter and contamination on the mask by frequently carrying out cleaning at the stage using the EUV reflective mask 200 for manufacturing a semiconductor device. Consequently, the EUV reflective mask 200 is required to demonstrate considerably more resistance to mask cleaning in comparison with transmissive masks for photolithography. The use of an Ru-based protective film containing Ti makes it possible to particularly enhance cleaning resistance to cleaning solutions such as sulfuric acid, sulfuric peroxide mixture (SPM), ammonia, ammonia peroxide mixture (APM), OH radical cleaning solution or ozone water having a concentration of not more than 10 ppm. Consequently, the requirement of the EUV reflective mask 200 to be resistant to mask cleaning can be satisfied.

There are no particular limitations on the thickness of the protective film 3 provided it allows the function of the protective film 3 to be demonstrated. From the viewpoint of reflectivity of EUV light, the thickness of the protective film 3 is preferably 1.0 nm to 8.0 nm and more preferably 1.5 nm to 6.0 nm.

A known deposition method can be used to form the protective film 3 without any particular restrictions. Specific examples of methods used to form the protective film 3 include sputtering and ion beam sputtering.

«Absorber Film»

The absorber film 4 is formed on the protective film 3 in order to absorb EUV light. A material that has the function of absorbing EUV light and can be processed by dry etching is used for the material of the absorber film 4. Nickel (Ni) metal alone or a nickel compound having Ni as the main component thereof is used for the material of the absorber film 4 of the present embodiment. Ni is a material that has a larger extinction coefficient than Ta and can be dry-etched with chlorine (Cl)-based gas. The refractive index n of Ni at 13.5 nm is about 0.948 and extinction coefficient k is about 0.073. In contrast, in the case of TaBN, which is an example of a conventional absorber film material, the refractive index thereof is about 0.949 and the extinction coefficient is about 0.030.

Examples of nickel compounds include compounds obtained by adding boron (B), carbon (C), nitrogen (N), oxygen (O), phosphorous (P), titanium (Ti), niobium (Nb), molybdenum (Mo), ruthenium (Ru), rhodium (Rh), tellurium (Te), palladium (Pd), tantalum (Ta) or tungsten (W) to nickel. The addition of these elements to nickel makes it possible to increase etching rate for improved processability and/or improve cleaning resistance. The content ratio of Ni of these nickel compounds is preferably not less than 50 at % to less than 100 at % and more preferably not less than 80 at % to less than 100 at %.

The absorber film 4 having for the material thereof the aforementioned nickel and nickel compounds can be formed by a known method such as a magnetron sputtering method in the manner of DC sputtering or RF sputtering.

The absorber film 4 can be used for the purpose of absorbing EUV light for a binary-type reflective mask blank 100. In addition, the absorber film 4 can have a phase shift function in consideration of the phase difference of EUV light for a phase shift-type reflective mask blank 100.

Figure 3:
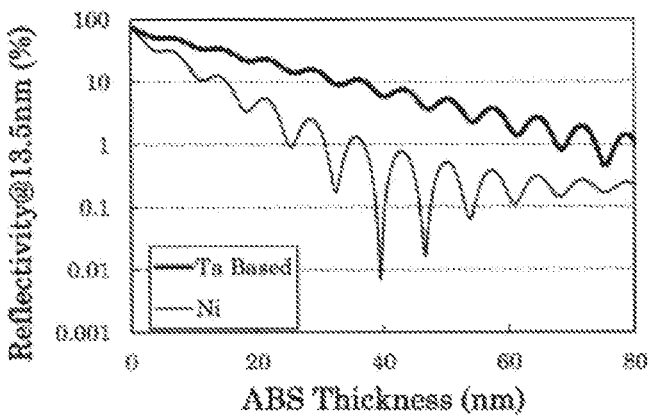
FIG. 3 is a graph indicating the relationship between the thickness of an absorber film and reflectivity to light having a wavelength of 13.5 nm.

In the case the absorber film 4 is used for the purpose of absorbing EUV light, the film thickness thereof is set so that reflectivity of EUV light with respect to the absorber film 4 is not more than 2%. As shown in FIG. 3, in the case of having formed the absorber film 4 with an Ni film, reflectivity at a wavelength of 13 nm at film thicknesses of 30 nm, 34.8 nm and 39.3 nm are 1.7%, 1.1% and 0.007%, respectively. In contrast, reflectivity cannot be made to be not more than 2% at a film thickness of not more than 50 nm in the case of having formed the absorber film with a TaBN film.

Figure 4:
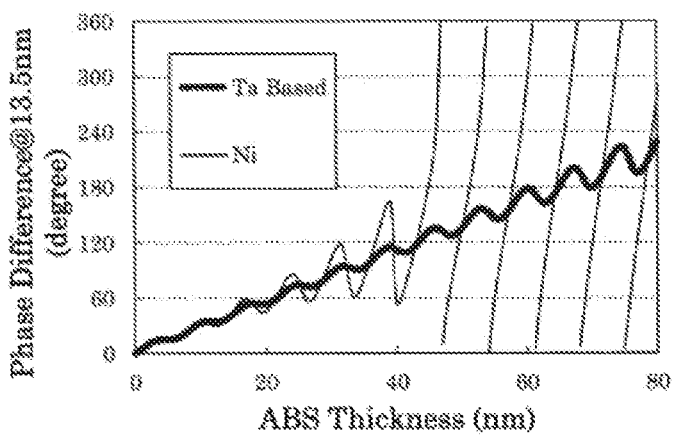
FIG. 4 is a graph indicating the relationship between the thickness of an absorber film and phase difference with respect to light having a wavelength of 13.5 nm.

In the case the absorber film 4 has a phase shift function, the portion where the absorber film 4 is formed absorbs and reduces the amount of EUV light while reflecting a portion of the light to a degree that does not have a detrimental effect on pattern transfer. On the other hand, light reflected from the field portion where the absorber film 4 is not formed is reflected by the multilayer reflective film 2 through the protective film 3. As a result of the absorber film 4 having a phase shift function, a desired phase difference can be formed between light reflected from the portion where the absorber film 4 is formed and the field portion. The absorber film 4 is formed so that the phase difference between light reflected from the absorber film 4 and light reflected from the multilayer reflective film 2 (field portion) is from 160° to 200°. Image contrast of a projected optical image improves due to mutual interference at a pattern edge of light differing in phase as a result of being inverted by 180°. Resolution improves accompanying the improvement in image contrast resulting in a wider range for various types of tolerance relating to exposure such as exposure quantity tolerance or focus tolerance. Although varying according to the pattern and exposure conditions, a general indicator of reflectivity for adequately obtaining this phase shift effect is not less than 1% in terms of absolute reflectivity and not less than 2% in terms of reflection ratio relative to the multilayer reflective film 2 (provided with the protective film 3). As shown in FIG. 4, in the case of having formed the absorber film 4 with a Ni film, the phase difference at a film thickness of 39 nm is about 160°. In contrast, in the case of having formed the absorber film with a TaBN film, the phase difference at a film thickness of 50 nm cannot be made to be from 160° to 200°.

The absorber film 4 can consist of a single layer. In addition, the absorber film 4 can be a multilayer film composed of a plurality of not less than two layers. In the case the absorber film 4 is a single layer film, the absorber film 4 is characterized by improved production efficiency since the number of step during mask blank fabrication can be reduced. In the case the absorber film 4 is a multilayer film, the optical constants and film thickness thereof are suitably set so that the upper layer film serves as an antireflective film during mask pattern inspections using light. As a result, inspection sensitivity when inspecting the mask pattern using light is improved. In this manner, various functions can be added to the absorber film 4 by using a multilayer absorber film 4. In the case the absorber film 4 has a phase shift function, the use of a multilayer absorber film 4 makes it possible to widen the range of optical adjustments thereby facilitating the obtaining of a desired reflectivity.

An oxide layer of a nickel compound is preferably formed on the surface of the absorber film 4. The formation of an oxide layer of a nickel compound makes it possible to improve cleaning resistance of an absorber pattern 4a of the resulting reflective mask 200. The thickness of the oxide layer is preferably not less than 1.0 nm and more preferably not less than 1.5 urn. In addition, the thickness of the oxide layer is preferably not more than 5 nm and more preferably not more than 3 nm. In the case the thickness of the Ni oxide layer is less than 1.0 nm, effects cannot be expected to be demonstrated due to the layer being excessively thin, while if the thickness exceeds 5 nm, the effect on surface reflectivity with respect to mask inspection light becomes excessively large, thereby making control difficult for obtaining a prescribed surface reflectivity.

Examples of methods used to form the oxide layer on a mask blank after having deposited the absorber film include hot water treatment, ozone water treatment, heat treatment in a gas containing oxygen, ultraviolet irradiation treatment in a gas containing oxygen, and $O_2$ plasma treatment.

«Etching Mask Film»

The etching mask film 5 is formed on the absorber film 4. A material that allows absorber film 4 to demonstrate high selectivity for the etching mask film 5 is used for the material of the etching mask film 5. Here, "high selectivity of B for A" refers to the ratio of the etching rates between the layer A on which etching is not carried out (layer serving as the mask) and the layer B on which etching is desired to be carried out More specifically, etching selectivity is specified with the equation "etching selectivity of B to A=etching rate of B/etching rate of A". In addition, "high selectivity" refers to a large value for selectivity as defined above with respect to a target for comparison. Etching selectivity of the absorber film 4 for the etching mask film 5 is preferably not less than 1.5, more preferably not less than 3 and even more preferably not less than 5.

Examples of materials for which etching selectivity of the absorber film 4 for the etching mask film 5 is high include materials containing chromium (Cr) and materials containing silicon (Si). Thus, a material containing chromium (Cr) or a material containing silicon (Si) can be used for the material of the etching mask film 5.

Examples of materials of the etching mask film 5 that contain chromium (Cr) include chromium compounds containing chromium and one or more elements selected from nitrogen, oxygen, carbon and boron. Examples of chromium compounds include CrN, CrON, CrCN, CrCON, CrBN, CrBON, CrBCN, CrBOCN and the like. A material substantially free of oxygen is preferable for increasing etching selectivity in chlorine-based gas. Examples of chromium compounds substantially free of oxygen include CrN, CrCN, CrBN, CrBCN and the like. The content ratio of Cr of the chromium compound is preferably not less than 50 at %/o to less than 100 at % and more preferably not less than 80 at % to less than 100 at %. In addition, "substantially free of oxygen" corresponds to an oxygen content in the chromium compound of not more than 10 at % and preferably not more than 5 at %. Furthermore, the aforementioned material can contain a metal other than chromium within a range that allows the effects of the present invention to be obtained.

Examples of materials of the etching mask film 5 containing silicon (Si) include silicon compounds containing silicon and one or more elements selected from nitrogen, oxygen, carbon and hydrogen, metallic silicon containing silicon and a metal (metal silicides), and metallic silicon compounds containing a silicon compound and metal (metal silicide compounds). Examples of materials containing silicon include SiO, SiN, SiON, SiC, SiCO, SiCN, SiCON, MoSi, MoSiO, MoSiN and MoSiON. Furthermore, the aforementioned material can contain a semi-metal or metal other than silicon within a range that allows the effects of the present invention to be obtained.

Ni exhibits a slower etching rate for chlorine-based gas in comparison with Ta. Consequently, when attempting to form a resist film 11 directly on the absorber film 4 composed of a material containing Ni, it is necessary to increase the thickness of the resist film 11, thereby making it difficult to form a fine pattern. On the other hand, as a result of forming the etching mask film 5 composed of a material containing Cr and/or Si on the absorber film 4, it is possible to etch the absorber film 4 without increasing the thickness of the resist film 11. Thus, use of the etching mask film 5 allows the formation of a fine absorber pattern 4a.

The film thickness of the etching mask film 5 is preferably not less than 3 nm from the viewpoint of obtaining the function of an etching mask for precisely forming a transfer pattern on the absorber film 4. In addition, the film thickness of the etching mask film 5 is preferably not more than 20 nm and more preferably not more than 15 nm from the viewpoint of reducing the film thickness of the resist film 11.

«Back Side Conductive Film»

The back side conductive film 6 for electrostatic chucking is typically formed on the side of the second main surface (back side) of the substrate 1 (opposite side of the side on which the multilayer reflective film 2 is formed). The back side conductive film for electrostatic chucking is normally required to demonstrate an electrical property of not more than 100 Ω/sq. The back side conductive film 6 can be formed by using targets consisting of a metal such as chromium or tantalum and an alloy by, for example, magnetron sputtering or ion beam sputtering. Typical materials of the back side conductive film 6 consist of CrN and Cr that are frequently used in the fabrication of mask blanks such as light-transmitting mask blanks. Although there are no particular limitations on the thickness of the back side conductive film 6 provided it satisfies the function of being used for electrostatic chucking, the thickness is normally from 10 nm to 200 nm. In addition, the back side conductive film 6 is also provided with the function of adjusting stress on the side of the second main surface of the mask blank 100. The back side conductive film 6 is adjusted so as to allow the obtaining of a flat reflective mask blank 100 by achieving balance with the stress of each type of film formed on the side of the first main surface.

<Reflective Mask and Fabrication Method Thereof>

The reflective mask 200 can be fabricated using the reflective mask blank 100 of the present embodiment. Here, only a general explanation is provided since a detailed explanation will be subsequently provided in the examples with reference to the drawings.

The reflective mask blank 100 is prepared and the resist film 11 is formed on the etching mask film 5 of the first main surface thereof (not required in the case of providing the resist film 11 as the reflective mask blank 100). Next, a desired pattern is drawn (exposed) on this resist film 11 followed by further developing and rinsing to form a prescribed resist pattern 11a.

In the case of using the reflective mask blank 100, the etching mask film 5 is first etched using the aforementioned resist pattern 11a as a mask and the etching mask pattern 5a is formed. Next, the resist pattern 11a is removed by ashing or with a resist stripping solution and the like. Subsequently, as a result of carrying out dry etching using this etching mask pattern 5a as a mask, the absorber film 4 is etched and the absorber pattern 4a is formed. Subsequently, the etching mask pattern 5a is removed by dry etching. Finally, wet cleaning is carried out using an acidic and/or alkaline aqueous solution.

Here, in the case the etching mask film 5 is composed of a material containing chromium (Cr), an example of an etching gas for forming the etching mask pattern 5 and removing the etching mask pattern 5a is a mixed gas containing a chlorine-based gas, such as $Cl_2$, $SiCl_4$, $CHCl_3$ and $CCl_4$, and $O_2$ at a prescribed ratio.

In addition, in the case the etching mask film 5 is composed of a material containing silicon (Si), examples of the etching gas used to form the pattern of the etching mask film 5 and remove the etching mask pattern 5a include fluorine-based gases such as $CF_4$, $CHF_3$, $C_2F_6$, $C_3F_6$, $C_4F_6$, $C_4F_8$, $CH_2F_2$, $CH_3F$, $C_3F_8$, $SF_6$ and $F_2$, and mixed gases containing these fluorine-based gases and He, $H_2$, $N_2$, Ar, $C_2H_4$, $O_2$ and the like (to be referred to as "fluorine-containing gas").

Examples of etching gas of the absorber film 4 include chlorine-based gases such as $Cl_2$, $SiCl_4$, $CHCl_3$ and $CCl_4$, mixed gases containing chlorine-based gas and He at a prescribed ratio, and mixed gases containing chlorine-based gas and Ar at a prescribed ratio. Since the etching gas is substantially free of oxygen during etching of the absorber film 4, there is no occurrence of roughness on a surface of the Ru-based protective film. In the present description, "etching gas is substantially free of oxygen" means that the content of oxygen in the etching gas is not more than 5 at %.

Furthermore, instead of removing the resist pattern 11a immediately after forming the etching mask pattern 5a, a method may also be employed in which the absorber film 4 is etched using the etching mask pattern 5a with resist pattern 11a as a mask. In this case, this method is characterized by the resist pattern 11a being removed automatically when etching the absorber film 4, thereby simplifying the process. On the other hand, a method in which the absorber film 4 is etched by using the etching mask pattern 5a, from which the resist pattern 11a has been removed, as a mask is characterized by enabling stable etching without causing a change in organic products (acidic gas) from the resist that disappears at an intermediate stage of etching.

The reflective mask 200 having a highly precise and fine pattern with little sidewall roughness is obtained with little shadowing effects as a result of employing the aforementioned process.

<Method of Manufacturing Semiconductor Device>

A desired transfer pattern based on the absorber film 4a on the reflective mask 200 can be formed on a semiconductor substrate by carrying out EUV lithography using the reflective mask 200 of the present embodiment while suppressing decreases in transfer dimensional accuracy caused by shadowing effects. In addition, since the absorber pattern 4a of the reflective mask 200 of the present embodiment is a fine and highly precise pattern having little sidewall roughness, a desired pattern can be formed on the semiconductor substrate with high dimensional accuracy. A semiconductor device having a desired electronic circuit formed thereon can be manufactured by going through various steps such as etching of processed films, formation of insulating and conductive films, introduction of dopant or annealing in addition to this lithography step.

In providing a more detailed explanation, the EUV exposure apparatus is composed of a laser plasma light source that generates EUV light, illumination optics, mask stage system, reduction projection optics, wafer stage system and vacuum equipment and the like. The light source is provided with a debris trapping function, a cutoff filter that cuts off long wavelength light other than exposure light, and equipment for vacuum differential evacuation and the like. The illumination optics and reduction projection optics are composed with reflective mirrors. The reflective mask 200 for EUV exposure is placed on a mask stage electrostatically chucked by the conductive film formed on the second main surface thereof.

EUV exposure light is radiated onto the reflective mask 200 via the illumination optics at an angle inclined by 6° to 8° C. to the normal of the main surface (line perpendicular to the main surface) of the reflective mask 200. Light reflected from the reflective mask 200 in response to this incident light is reflected in the opposite and at the same angle as the incident light (specular reflection) and is guided to the reduction projection optics normally having a reduction ratio of ¼, followed by exposure of the resist on a wafer (semiconductor substrate) placed on the wafer stage. A vacuum is drawn in the EUV exposure apparatus at least at the location where EUV light passes therethrough. In carrying out exposure, scanning exposure exposing with a slit is commonly employed in which the mask stage and wafer stage are scanned in synchronization at a speed corresponding to the reduction ratio of the reduction projection optics. Following exposure of the resist, the exposed resist film is developed to enable a resist pattern to be formed on the semiconductor substrate. In the present invention, a mask is used that consists of a thin film having little shadowing effects and has a highly precise phase shift pattern with little sidewall roughness. Consequently, the resist pattern formed on the semiconductor substrate is a desired resist pattern having high dimensional accuracy. As a result of carrying out etching and the like using this resist pattern as a mask, a prescribed wiring pattern, for example, can be formed on a semiconductor substrate. A semiconductor device is manufactured by going through this exposure step, processed film processing step, insulating film and conductive film formation step, dopant introduction step, annealing step and other necessary steps.

EXAMPLES

The following provides an explanation of examples with reference to the drawings. Furthermore, in the examples, the same reference symbols are used to represent the same constituents and explanations thereof may be simplified or omitted.

Figure 2:
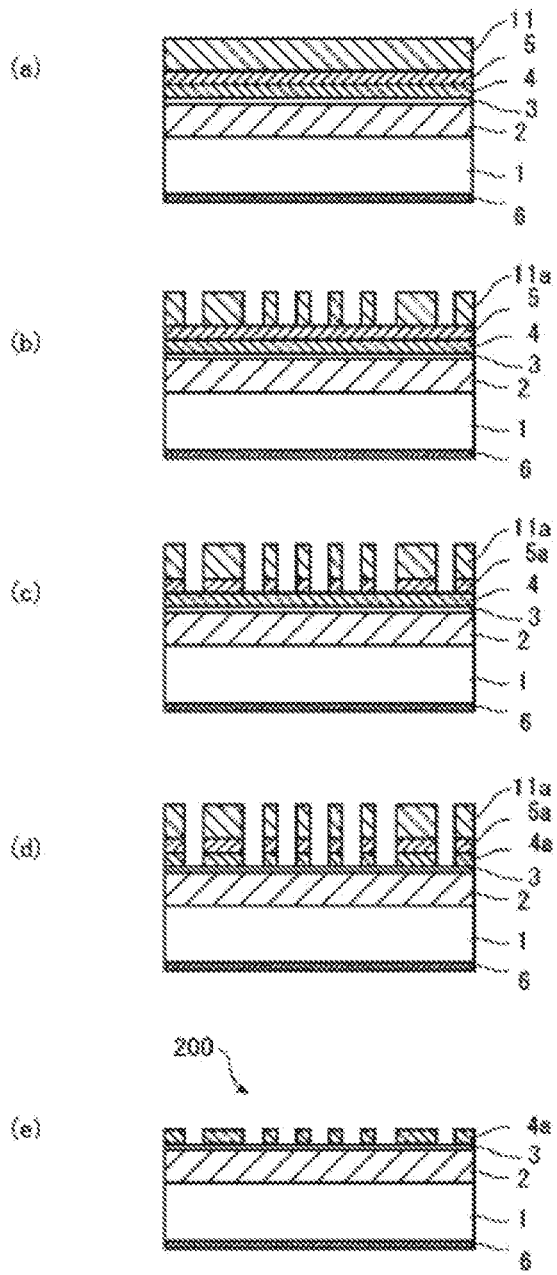
FIG. 2 is a process drawing indicating a process for fabricating a reflective mask from a reflective mask blank with a cross-sectional schematic diagram of the main portions thereof.
Figure 7:
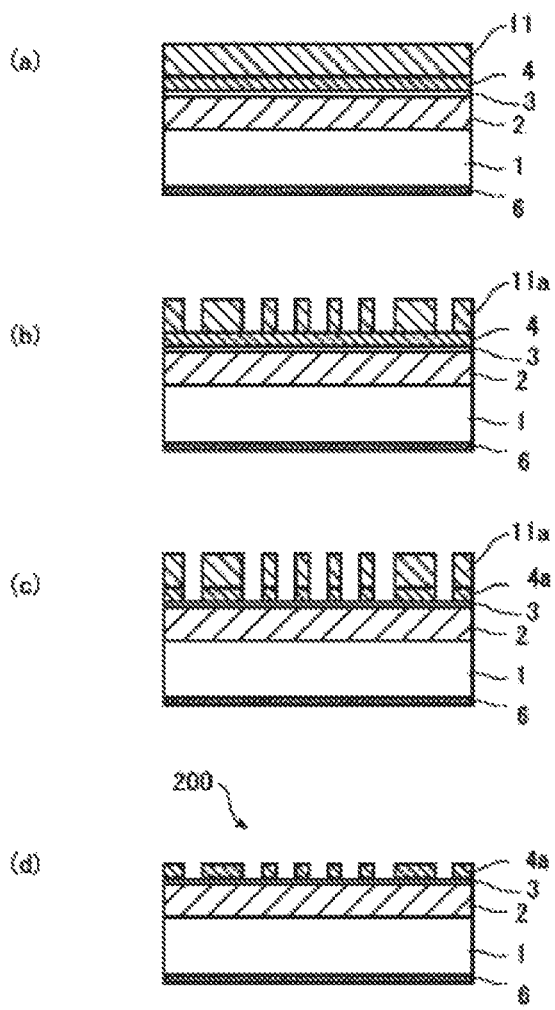
FIG. 7 is a process drawing indicating a process in the case of fabricating a reflective mask using the reflective mask blank of Comparative Example 1 with a cross-sectional schematic drawing of the important portions thereof.

FIG. 2 is cross-sectional schematic diagram of main portions indicating a process for fabricating the reflective mask 200 from the reflective mask blank 100 of Examples 1 and 2. FIG. 7 is a process drawing indicated with a cross-sectional schematic diagram of main portions of a process for attempting to fabricate the reflective mask 200 from a reflective mask blank of Comparative Example 1.

Example 1

An explanation is first provided for the reflective mask blank 100 of Example 1. The reflective mask blank 100 of Example 1 has the back side reflective film 6, the substrate 1, the multilayer reflective film 2, the protective film 3, the absorber film 4 and the etching mask film 5. The absorber film 4 is composed of nickel and the etching mask film 5 is composed of a chromium-based material. Furthermore, as shown in FIG. 2(a), the resist film 11 is formed on the etching mask film 5.

First, an explanation is provided for the substrate 1 used in the reflective mask blank 100 of Example 1. A 6025 size (approx. 152 mm×152 mm×6.35 mm) glass substrate of a $SiO_2$—$TiO_2$-based glass substrate having a low coefficient of thermal expansion, of which both the first main surface and second main surface were polished, was prepared for use as the substrate 1. The $SiO_2$—$TiO_2$-based glass substrate (the substrate 1) was polished with a rough polishing step, precision polishing step, local processing step and touch-up polishing step to provide flat and smooth main surfaces.

The back side conductive film 6 composed of CrN was formed under the following conditions by magnetron sputtering (reactive sputtering) on the second main surface (back side) of the $SiO_2$—$TiO_2$-based glass substrate 1. Furthermore, in the present description, the ratio of a mixed gas is expressed as the percent by volume (vol %) of the introduced gases.

Back side conductive film formation conditions: Cr target, mixed gas atmosphere of Ar and $N_2$ (Ar: 90%, N: 10%), film thickness: 20 nm Next, the multilayer reflective film 2 was formed on the main surface (first main surface) of the substrate 1 on the opposite side from the side having the back side conductive film 6 formed thereon. In order to obtain a multilayer reflective film 2 suitable for EUV light having a wavelength of 13.5 nm, the multilayer reflective film 2 formed on the substrate 1 is in the form of a cyclically multilayer reflective film composed of Mo and Si. The multilayer reflective film 2 was formed by alternately laminating a Mo layer and Si layer on the substrate 1 by ion beam sputtering in an Ar gas atmosphere using a Mo target and Si target. First, a Si film was deposited at a thickness of 4.2 nm followed by depositing a Mo film having a thickness of 2.8 nm. Defining this as one cycle, these films were deposited for 40 cycles followed finally by depositing a Si film at a thickness of 4.0 nm to form the multilayer reflective film 2. Here, although the number of lamination cycles was set at 40, there are no particular limitations thereon. For example, the number of lamination cycles can be 60 cycles. Although the number of steps increases in the case of laminating for 60 cycles in comparison with laminating for 40 cycles, reflectivity of the multilayer reflective film 2 to EUV light can be enhanced.

Continuing, the Ru protective film 3 was deposited at a thickness of 2.5 nm by ion beam sputtering in an Ar gas atmosphere using a Ru target.

Next, a Ni film was formed as the absorber film 4 by DC sputtering. The Ni film was deposited at film thicknesses of 30 nm, 34.8 nm and 39.5 nm, respectively, in an Ar gas atmosphere using a Ni (Ni) target to fabricate three substrates with an absorber film. The refractive index n and extinction coefficient (imaginary component of refractive index) k of the aforementioned deposited Ni film at a wavelength of 13.5 nm were as respectively shown below.

Ni: n=approx. 0.948, k=approx. 0.073

Figure 5:
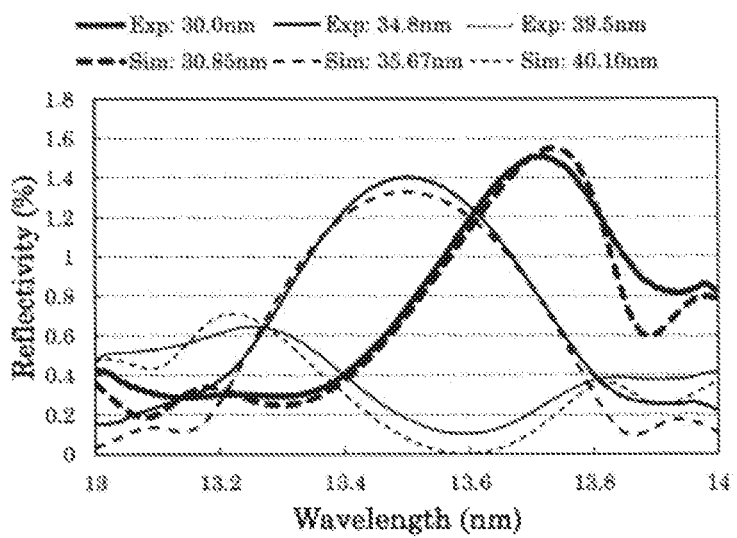
FIG. 5 is a graph indicating the EUV reflectivity spectrum of substrates having an absorber film deposited at various film thicknesses.

Measurement of the EUV reflectivity spectra of the fabricated three substrates with an absorber film (thicknesses of absorber films 4: 30 nm, 34.8 nm, 39.5 nm) yielded the spectra shown in FIG. 5. As indicated by the solid line of FIG. 5, reflectivity of the substrates with an absorber film at a wavelength of 13.5 nm was 1.4%, 0.73% and 0.18%, respectively, and not more than 2% in all cases. In addition, simulation results are indicated with broken lines in FIG. 5 for reference purposes. It was determined from FIG. 5 that favorable agreement was demonstrated between the spectra of the measured values and the simulations.

A CrN film was deposited as the etching mask film 5 on the fabricated three substrates with an absorber film under the conditions indicated below by magnetron sputtering (reactive sputtering).

Etching mask film formation conditions: Cr target, mixed gas atmosphere of Ar and N2 (Ar: 90%, N: 10%)

Film thicknesses: 10 nm (thickness of absorber film 4: 30 nm), 11.6 nm (thickness of absorber film 4: 34.8 nm), 13.2 nm (thickness of absorber film 4: 39.5 nm) Measurement of the elemental composition of the etching mask film 5 by Rutherford backscattering analysis yielded results of Cr: 90 at % and N: 10 at %.

Next, the reflective mask 200 of Example 1 was fabricated using the reflective mask blank 100 of Example 1.

The resist film 11 was formed on the etching mask film 5 of the reflective mask blank 100 at a thickness of 100 nm (FIG. 2(*a*)). A desired pattern was drawn (exposed) on this resist film 11 followed by developing and rinsing to form a prescribed resist pattern 11*a* (FIG. 2(*b*)). Next, dry etching of a CrN film (etching mask film 5) was carried out by using the resist pattern 11*a* as a mask using a mixed gas of $Cl_2$ gas and $O_2$ ($Cl_2+O_2$ gas). The etching mask pattern 5*a* was able to be formed by this dry etching (FIG. 2(*c*)). Continuing, the absorber pattern 4*a* was formed by carrying out dry etching of a Ni film (absorber film 4) using $Cl_2$ gas (FIG. 2(*d*)).

The absorber film 4 composed of a Ni film is more difficult to etch in comparison with a Ta-based material. In the case of Example 1, the absorber film 4 composed of a Ni film was able to be easily etched by forming the etching mask film 5 on the absorber film 4. In addition, since the thickness of the resist pattern 11 for forming a transfer pattern can be reduced, the reflective mask 200 can be obtained having a fine pattern. In the case the etching mask film 5 is absent, the resist pattern 11*a* ends up being etched by $Cl_2$ gas during etching of the absorber film 4, thereby making it necessary to thicken the thickness of the resist film 11. Resolution becomes low in the case of a thick resist film 11. In addition, pattern collapse occurs during pattern development and rinsing if the aspect ratio (height/line width) of the resist pattern 11*a* becomes large. In Example 1, as a result of forming the etching mask film 5 composed of a material having high etching selectivity on the absorber film 4, the absorber film 4 can be etched easily and thickness of the resist film 11 can be reduced, thereby making it possible to suppress the occurrence of problems such as decreases in resolution and pattern collapse. Here, etching selectivity of the absorber film 4 with respect to the etching mask film 5 was 6.7.

Subsequently, the resist pattern 11*a* was removed by ashing or the use of a resist stripping solution and the like. In addition, the etching mask pattern 5*a* was removed by dry etching using a mixed gas of $Cl_2$ gas and $O_2$. Finally, wet cleaning was carried out using distilled water (DIW). The reflective mask 200 of Example 1 was fabricated with the aforementioned process (FIG. 2(*e*)). Furthermore, mask defects may be suitably repaired by carrying out a mask defect inspection following wet cleaning as necessary.

In the reflective mask 200 of Example 1, since the etching mask film 5 is a chromium-based material, processability with a mixed gas of chlorine-based gas and oxygen gas is favorable and the etching mask pattern 5*a* was able to be formed with high precision. In addition, since the film thicknesses of the absorber patterns 4*a* were 30 nm, 34.8 nm and 39.5 nm, respectively, demonstrating thicknesses that were less than that of an absorber film formed with a conventional Ta-based material, shadowing effects were able to be reduced.

Figure 6:
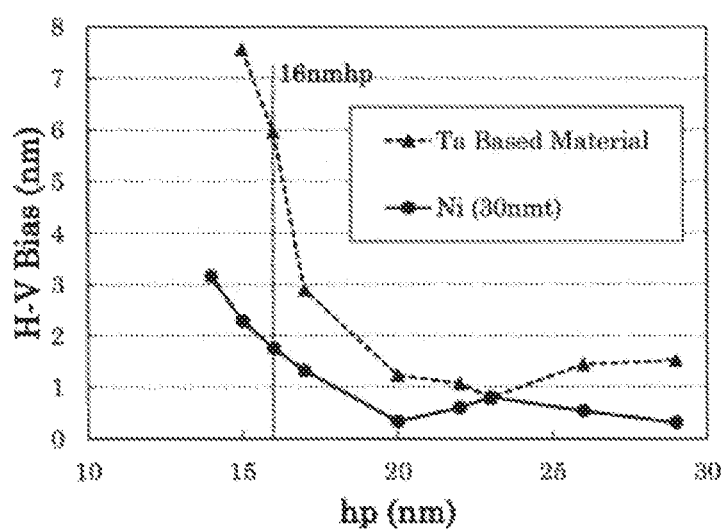
FIG. 6 is a graph indicating the H-V bias of an absorber film formed with an Ni film and an absorber film formed with a TaBN film.

In addition, H-V bias was evaluated for the reflective mask 200 having the absorber pattern 4*a* formed thereon at a film thickness of 30 nm. As shown in FIG. 6, the Ni film made it possible to reduce H-V bias to about one-third of that of a TaBN film.

In addition, resistance to cleaning with DIW was evaluated for the reflective mask 200 having the absorber pattern 4*a* formed thereon at a film thickness of 30 nm. According to this evaluation of cleaning resistance, the reduction in thickness before and after cleaning was about 0.08 nm, thereby confirming the absence of any problems with respect to cleaning resistance. More specifically, although the bulk portion with a Ni oxide film of a surface layer having a thickness of 1.10 nm had a thickness of 28.29 nm prior to cleaning, the thicknesses were 1.10 nm and 28.21 nm, respectively, after cleaning.

Since there are no problems with cleaning resistance of the reflective mask 200 of Example 1 and a Ni oxide layer is present on the surface of the absorber pattern 4*a*, the Ni oxide layer on the surface of the absorber pattern 4*a* is suggested to have a favorable effect on cleaning resistance, thereby resulting in an improvement of cleaning resistance. Furthermore, the Ni oxide layer of Example 1 is an oxide layer obtained by natural oxidation and the thickness of the oxide layer is not thought to be uniform. It is presumed that cleaning resistance can be further improved in the case of having intentionally formed the Ni oxide layer to have a prescribed uniform thickness. In order improve cleaning resistance, the thickness of the Ni oxide layer can be presumed to preferably be not less than 1.0 nm and more preferably not less than 1.5 nm. In addition, the thickness of the Ni oxide layer can be presumed to preferably not more than 5 nm and more preferably not more than 3 nm.

The reflective mask 200 fabricated in Example 1 was placed in an EUV scanner and a wafer having a processed film and resist film formed on a semiconductor substrate was subjected to EUV exposure. A resist pattern was formed on the semiconductor substrate having the processed film formed thereon by developing this exposed resist film.

This resist pattern was transferred to the processed film by etching and a semiconductor device having desired properties was able to be manufactured by going through the various steps of insulating film and conductive film formation, dopant introduction or annealing and the like.

Example 2

The following provides an explanation of the reflective mask blank 100 of Example 2. The reflective mask blank 100 of Example 2 has the back side conductive film 6, the substrate 1, the multilayer reflective film 2, the protective film 3, the absorber film 4 and the etching mask film 5 in the same manner as Example 1. The reflective mask blank 100 of Example 2 is the same as that of Example 1 with the exception of the etching mask film 5 being composed of a silicon-based material.

Three substrates with an absorber film were fabricated in the same manner as Example 1. $SiO_2$ films were respectively formed as etching mask films 5 on these three substrates with an absorber film by RF sputtering under the conditions indicated below.

Etching mask film formation conditions: $SiO_2$ target, Ar gas atmosphere (Ar: 100%)

Film thicknesses: 13 nm (thickness of absorber film 4: 30 nm, 15.1 nm thickness of absorber film 4: 34.8 nm), 17.2 nm (thickness of absorber film 4: 39.5 nm)

Measurement of the elemental composition of the etching mask film 5 by Rutherford backscattering analysis confirmed that the etching mask film 5 is an $SiO_2$ film.

Next, the reflective mask 200 of Example 2 was fabricated using the reflective mask blank 100 of Example 2.

The resist film 11 was formed on the etching mask film 5 of the reflective mask blank 100 at a thickness of 100 nm in the same manner as Example 1 (FIG. 2(a)). A desired pattern was drawn (exposed) on this resist film 11 followed by developing and rinsing to form a prescribed resist pattern 11a (FIG. 2(b)). Next, dry etching of a $SiO_2$ film (an etching mask film 5) was carried out by using the resist pattern 11a as a mask using a fluorine-containing gas (and specifically, $CF_4$ gas). The etching mask pattern 5a was able to be formed by this dry etching (FIG. 2(c)). Continuing, the absorber pattern 4a was formed by carrying out dry etching of a Ni film (an absorber film 4) using $Cl_2$ gas (FIG. 2(d)).

In Example 2, the absorber film 4 composed of a Ni film was able to be easily etched by forming the etching mask film 5 on the absorber film 4 in the same manner as Example 1. In addition, since the thickness of the resist pattern 11 for forming a transfer pattern can be reduced, the reflective mask 200 can be obtained having a fine pattern. In Example 2, as a result of forming the etching mask film 5 composed of a material having high etching selectivity on the absorber film 4, the absorber film 4 can be etched easily and thickness of the resist film 11 can be reduced. Thus, in Example 2, the occurrence of problems such as decreases in resolution and pattern collapse were able to be suppressed. Here, etching selectivity of the absorber film 4 with respect to the etching mask film 5 was 5.2.

Subsequently, the resist pattern 11a was removed by ashing or the use of a resist stripping solution and the like. In addition, the etching mask pattern 5a was removed by dry etching using a fluorine-containing gas (and specifically, $CF_4$ gas). Finally, wet cleaning was carried out using distilled water (DIW). The reflective mask 200 of Example 2 was fabricated with the aforementioned process (FIG. 2(e)). Furthermore, mask defects may be suitably repaired by carrying out a mask defect inspection following wet cleaning as necessary.

In the reflective mask 200 of Example 2, since the etching mask film 5 is a silicon-based material, processability with a fluorine-containing gas is favorable and the etching mask pattern 5a was able to be formed with high precision. In addition, since the film thicknesses of the absorber patterns 4a were 30 nm, 34.8 nm and 39.5 nm, respectively, demonstrating thicknesses that were less than that of an absorber film formed with a conventional Ta-based material, shadowing effects were able to be reduced.

In addition, H-V bias of the reflective mask 200 was able to be reduced in the same manner as Example 1, and it was possible to confirm the absence of problems with cleaning resistance. In addition, a semiconductor device having desired properties was able to be manufactured in the same manner as Example 1 by using the reflective mask 200 of Example 2.

Comparative Example 1

The following provides an explanation of a reflective mask blank of Comparative Example 1. The reflective mask blank of Comparative Example 1 has the back side conductive film 6, the substrate 1, the multilayer reflective film 2, the protective film 3 and the absorber film 4. However, the reflective mask blank of Comparative Example 1 differs from that of Example 1 in that it does not have the etching mask film 5. The substrate 1, multilayer reflective film 2, protective film 3 and absorber film 4 of the reflective mask blank of Comparative Example 1 are the same as those of Example 1.

Next, the reflective mask 200 of Comparative Example 1 was attempted to be fabricated using the reflective mask blank of Comparative Example 1.

The resist film 11 was formed on the absorber film 4 of the reflective mask blank at a thickness of 100 nm (FIG. 7(a)). A desired pattern was drawn (exposed) on this resist film 11 followed by developing and rinsing to form a prescribed resist pattern 11a (FIG. 7(b)). Next, dry etching of a Ni film (absorber film 4) was carried out using $Cl_2$ gas in attempt to form the absorber film 4 (FIG. 7(c)). Subsequently, the resist pattern 11a was scheduled to be removed by ashing or the use of a resist stripping solution and the like to obtain the reflective mask 200 as shown in FIG. 7(d).

The absorber film 4 composed of a Ni film is difficult to etch in comparison with a Ta-based material. Consequently, in the case of Comparative Example 1, the absorber film 4 composed of a Ni film was unable to be etched easily as a result of not having formed the etching mask film 5 on the absorber film 4. Namely, the resist pattern 11a ended up being removed by etching prior to formation of the absorber pattern 4. Thus, in the case of Comparative Example 1, the absorber pattern 4a as shown in FIG. 7(c) and the reflective mask 200 as shown in FIG. 7(d) were unable to be obtained.

Based on the results of Comparative Example 1, in the case of not forming the etching mask film 5 on the absorber film 4, it can be said that an extremely thick resist film 11 is required. Namely, in the case the etching mask film 5 is absent, since the etching pattern 11a ends up being etched during dry etching of the absorber film 4 by $Cl_2$ gas, it becomes necessary to make the film thickness of the resist film 11 thick. However, in the case of having a thick resist film 11, the problem occurs of low resolution. In addition, if the aspect ratio (height/line width) of the resist pattern 11a becomes excessively large, the problem of pattern collapse occurs during pattern development and rinsing.

BRIEF DESCRIPTION OF REFERENCE SYMBOLS

1 Substrate
2 Multilayer reflective film
3 Protective film
4 Absorber film
4a Absorber pattern
5 Etching mask film
5a Etching mask pattern
6 Back side conductive film
11 Resist film
11a Resist pattern
100 Reflective mask blank
200 Reflective mask

The invention claimed is:

1. A reflective mask blank comprising a multilayer reflective film, an absorber film and an etching mask film on a substrate in that order; wherein,
the absorber film is made of a material containing nickel (Ni), and
the etching mask film is made of a material containing chromium (Cr).

2. The reflective mask blank according to claim 1, wherein the etching mask film is made of a material containing chromium (Cr) and substantially containing no oxygen (O).

3. The reflective mask blank according to claim 1, comprising a protective film between the multilayer reflective film and the absorber film, and wherein, the protective film is made of a material containing ruthenium (Ru).

4. A method of manufacturing a reflective mask, comprising:
forming a resist pattern on the etching mask film of the reflective mask blank according to claim 1,
forming an etching mask pattern by using the resist pattern as a mask and patterning the etching mask film by dry etching with a dry etching gas containing a chlorine-based gas and oxygen gas, and
forming an absorber pattern by using the etching mask pattern as a mask and patterning the absorber film by dry etching with a dry etching gas that contains a chlorine-based gas and substantially contains no oxygen.

5. The method of manufacturing a reflective mask according to claim 4, wherein the etching mask pattern is stripped after having formed the absorber pattern.

6. A method of manufacturing a semiconductor device having a step for placing the reflective mask obtained according to the method of manufacturing a reflective mask according to claim 4 in an exposure apparatus having an exposure light source emitting EUV light, and transferring a transfer pattern to a resist film formed on a transferred substrate.

7. The reflective mask blank according to claim 2, wherein a film thickness of the etching mask film is not less than 3 nm and not more than 15 nm.

8. The reflective mask blank according to claim 1, wherein
the absorber film comprises an oxide layer of a nickel compound, the oxide layer being a surface layer of the absorber film,
a film thickness of surface layer is not less than 1 nm and not more than 5 nm.

9. The reflective mask blank according to claim 1, wherein the absorber film is made of a material of a nickel compound comprising a nickel and at least one selected from titanium (Ti), niobium (Nb), molybdenum (Mo), ruthenium (Ru), rhodium (Rh), tellurium (Te), palladium (Pd), tantalum (Ta) and tungsten (W).

10. The reflective mask blank according to claim 8, wherein a content ratio of Ni of the nickel compound is not less than 50 at % and less than 100 at %.

11. The reflective mask blank according to claim 1, wherein the absorber film has a phase shift function.

12. A reflective mask blank comprising a multilayer reflective film, an absorber film and an etching mask film on a substrate in that order; wherein,
the absorber film is made of a material containing nickel (Ni),
the etching mask film is made of a material containing silicon (Si).

13. The reflective mask blank according to claim 12, wherein
a film thickness of the etching mask film is not less than 3 nm and not more than 20 nm.

14. The reflective mask blank according to claim 12, wherein
the absorber film comprises an oxide layer of a nickel compound, the oxide layer being a surface layer of the absorber film,
a film thickness of surface layer is not less than 1 nm and not more than 5 nm.

15. The reflective mask blank according to claim 12, wherein the absorber film is made of a material of a nickel compound comprising a nickel and at least one selected from titanium (Ti), niobium (Nb), molybdenum (Mo), ruthenium (Ru), rhodium (Rh), tellurium (Te), palladium (Pd), tantalum (Ta) and tungsten (W).

16. The reflective mask blank according to claim 14, wherein a content ratio of Ni of the nickel compound is not less than 50 at % and less than 100 at %.

17. The reflective mask blank according to claim 12, wherein the absorber film has a phase shift function.

18. The reflective mask blank according to claim 12, comprising a protective film between the multilayer reflective film and the absorber film, and wherein,
the protective film is made of a material containing ruthenium (Ru).

19. A method of manufacturing a reflective mask, comprising:
forming a resist pattern on the etching mask film of the reflective mask blank according to claim 12,
forming an etching mask pattern by using the resist pattern as a mask and patterning the etching mask film by dry etching with a dry etching gas containing a fluorine-containing gas, and
forming an absorber pattern by using the etching mask pattern as a mask and patterning the absorber film by dry etching with a dry etching gas that contains a chlorine-based gas and substantially contains no oxygen.

20. The method of manufacturing a reflective mask according to claim 19, wherein the etching mask pattern is stripped after having formed the absorber pattern.

21. A method of manufacturing a semiconductor device having a step for placing the reflective mask obtained according to the method of manufacturing a reflective mask according to claim 19 in an exposure apparatus having an exposure light source emitting EUV light, and transferring a transfer pattern to a resist film formed on a transferred substrate.

* * * * *